(12) United States Patent
Kim et al.

(10) Patent No.: US 12,533,706 B2
(45) Date of Patent: Jan. 27, 2026

(54) GAS SUPPLYING METHOD USING GAS DISTRIBUTING UNIT

(71) Applicant: JUSUNG ENGINEERING CO., LTD., Gwangju-si (KR)

(72) Inventors: Hyeon Chang Kim, Gwangju-si (KR); Yoon Jeong Kim, Gwangju-si (KR); Kwang Su Yoo, Gwangju-si (KR); Yong Hyun Lee, Gwangju-si (KR); Jin Ho Lee, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 291 days.

(21) Appl. No.: 18/020,620

(22) PCT Filed: Aug. 4, 2021

(86) PCT No.: PCT/KR2021/010229
§ 371 (c)(1),
(2) Date: Aug. 29, 2023

(87) PCT Pub. No.: WO2022/035121
PCT Pub. Date: Feb. 17, 2022

(65) Prior Publication Data
US 2024/0050981 A1    Feb. 15, 2024

(30) Foreign Application Priority Data
Aug. 10, 2020  (KR) .......... 10-2020-0099695

(51) Int. Cl.
*B05D 1/02* (2006.01)
*B05B 12/08* (2006.01)

(52) U.S. Cl.
CPC .............. *B05D 1/02* (2013.01); *B05B 12/085* (2013.01)

(58) Field of Classification Search
CPC ............................ B05D 1/02; B05B 12/085
See application file for complete search history.

(56) References Cited

U.S. PATENT DOCUMENTS

2016/0148813 A1*  5/2016  Rogers ............... H01J 37/3244
                                                  438/714

FOREIGN PATENT DOCUMENTS

| KR | 20050034610 A |   | 4/2005 |             |
|----|---------------|---|--------|-------------|
| KR | 20150113620 A |   | 10/2015|             |
| KR | 2018014583 A  | * | 2/2018 | ....... H01L 21/02046 |

(Continued)

OTHER PUBLICATIONS

KR20180014583a, machine translation. (Year: 2018).*
International Search Report for PCT/KR2021/010229 mailed Nov. 10, 2021.

*Primary Examiner* — Robert A Vetere
(74) *Attorney, Agent, or Firm* — Renaissance IP Law Group LLP (57) ABSTRACT

Provided is a gas supply method using a gas distribution unit which includes a plurality of gas flow rate control devices installed on a plurality of gas suppling channels, respectively, and is configured to individually control the flow rates of process gases supplied through the respective gas supply channels, and differently adjust the gas supply times and supply order of process gases supplied through the respective gas supplying channels, thereby improving the uniformity in thickness of the deposited thin film across the entire surface area of the substrate.

5 Claims, 9 Drawing Sheets

(56) References Cited

FOREIGN PATENT DOCUMENTS

| KR | 20180014583 A | 2/2018 |
| KR | 101839578 B1 | 3/2018 |
| KR | 20190035149 A | 4/2019 |

* cited by examiner

GAS SUPPLYING METHOD USING GAS DISTRIBUTING UNIT

TECHNICAL FIELD

The present disclosure relates to a gas supplying method, and more particularly, to a gas supplying method using a gas distributing unit, which includes a plurality of gas flow rate control devices installed on a plurality of gas supplying channels of the gas distributing unit, respectively, and individually controls the flow rates and the distribution order of gases through the respective gas supplying channels, thereby improving the uniformity in thickness of a deposited thin film across the entire surface area of a substrate.

RELATED ART

In general, a variety of processes are performed to fabricate a semiconductor device or flat display device. The variety of processes include a thin film deposition process of depositing a thin film made of a specific material on a substrate, a photolithography process of exposing or concealing a selected region of the thin film by using a photosensitive material, and an etching process of patterning the thin film in a desired manner by removing the selected region of the thin film. Each of the processes is performed in a substrate processing device which is designed to provide the optimal environment for the corresponding process.

In particular, one of important control elements in the deposition process is the uniformity in thickness of the thin film deposited on the substrate. Specifically, it is important to control the thickness of the thin film deposited on the substrate such that the thin film is uniformly formed across the entire surface area of the substrate. When the thickness of the deposited thin film across the entire surface area of the substrate is not uniform, the quality of a product or the performance of a semiconductor device or flat display device is degraded.

Figure 1A:
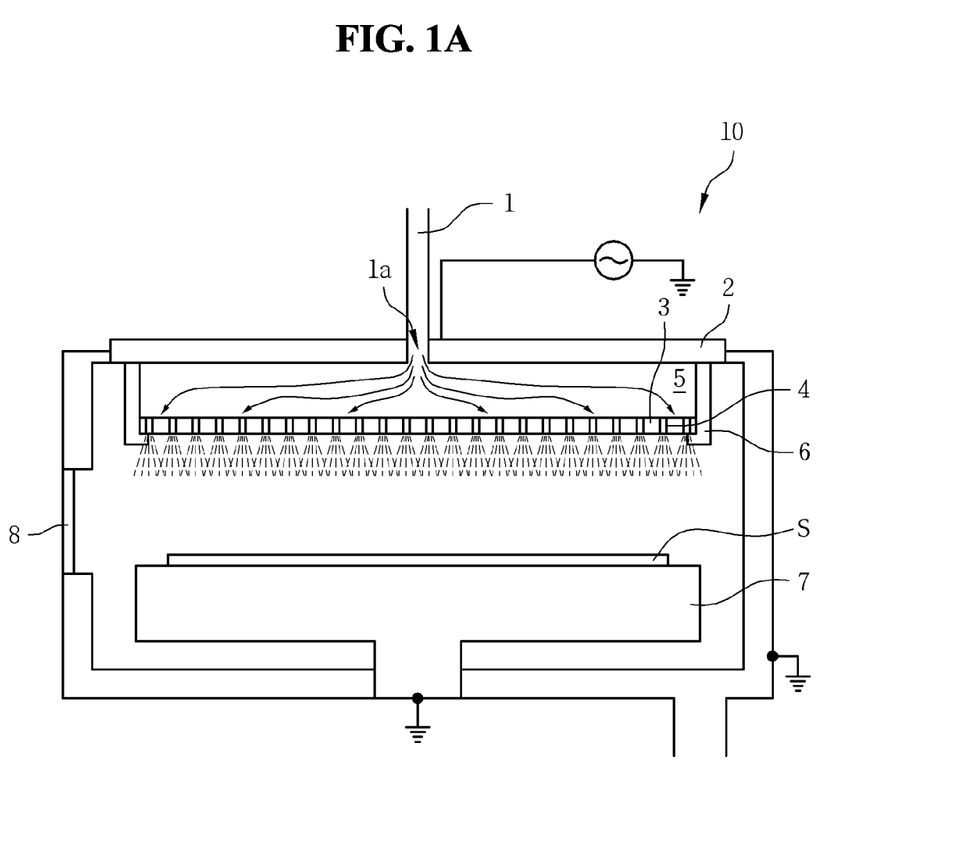
FIG. 1A is a schematic view illustrating a substrate processing device according to the related art.
Figure 1B:
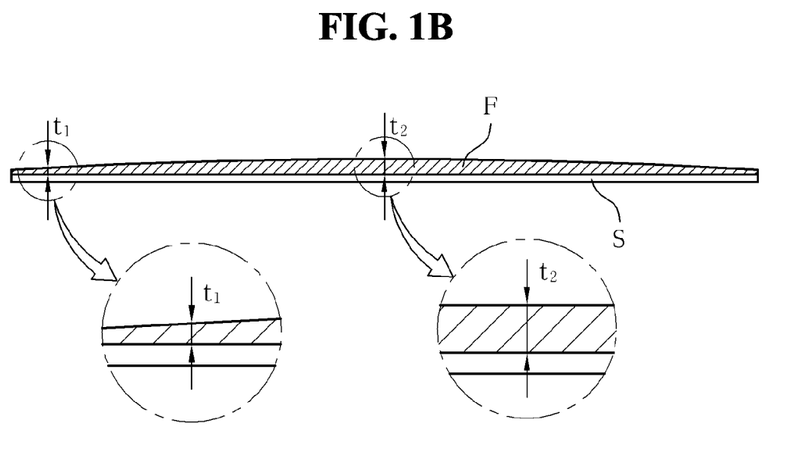
FIG. 1B is a schematic cross-sectional view illustrating a substrate on which a deposition process has been completely performed by the substrate processing device of FIG. 1A.

FIG. 1A is a schematic view illustrating a substrate processing device according to the related art, and FIG. 1B is a schematic cross-sectional view illustrating a substrate on which a deposition process has been completely performed by the substrate processing device of FIG. 1A.

As illustrated in FIG. 1A, a reaction chamber 10 according to the related art includes a gas supply channel 1 through which a source gas is supplied from a source material storage unit, a gas distributing plate 3 configured to spray the source gas discharged from the gas supply channel 1 onto the top of a substrate seating unit 7, an outlet 1a of the gas supply channel 1, and a gas diffusion space 5 formed over the gas distributing plate 3 and configured to diffuse the source gas.

The gas distributing plate 3 according to the related art includes a plurality of spraying holes 4 formed through one surface and the other surface of the gas distributing plate.

Referring to FIG. 1A, the distances from the outlet of the gas supply channel to the respective spraying holes are different from one another. Therefore, the lengths of source gas diffusion paths through which the source gas discharged from the outlet of the gas supply channel diffuses in the gas diffusion space so as to reach the inlets of the spraying holes are different depending on the positions of the respective spraying holes. As a result, the outlet of the spraying hole which is located at an edge portion of the gas distributing plate and thus has the longest source gas diffusion path, among the spraying holes of the gas distributing plate, has lower partial pressures than the outlet of the spraying hole which is located in the central portion of the gas distributing plate and has the shortest source gas diffusion path. Therefore, the flow rate of the source gas discharged from the spraying hole at the edge portion of the gas distributing plate is inevitably lower than that of the source gas discharged from the spraying hole in the central portion of the gas distributing plate. Thus, as illustrated in FIG. 1B, the thickness t2 of the thin film deposited on the central portion of the substrate is inevitably much larger than the thickness t1 of the thin film deposited on the edge portion of the substrate. That is, in the related art, the source gas is sprayed at different flow rates depending on the positions of the spraying holes formed in the gas distributing plate, which makes it difficult to guarantee the uniformity in thickness of the deposited thin film across the entire surface area of the substrate.

In order to solve such a problem, the diffusion space in the substrate processing device according to the related art is divided into a plurality of diffusion regions through partition walls, and a gas distributing unit for supplying process gas to the diffusion regions is configured to include a plurality of gas supply channels, in order to improve the uniformity in thickness of the deposited thin film across the entire surface area of the substrate.

Even in the substrate processing device according to the related art, however, the diffusion space is divided into the plurality of diffusion regions by the partition walls, and the gas distributing unit including the plurality of gas supply channels supplies gas only to each of the diffusion regions through the gas supply channel corresponding to the diffusion region, in order to perform the gas diffusion. Thus, the deformation of an electrode may occur in the chamber of the substrate processing device due to a temperature imbalance at a slot valve part, a pressure imbalance by the presence of an exhaust unit and a size imbalance between wall heaters formed on the major and minor axes of the chamber. Therefore, there is a limitation in improving the uniformity in thickness of the deposited thin film across the entire surface area of the substrate.

DETAILED DESCRIPTION

Technical Problem

Various embodiments are directed to a gas supplying method using a gas distributing unit, which includes a plurality of gas flow rate control devices installed on a plurality of gas supplying channels of the gas distributing unit, respectively, and individually controls the flow rates and the distribution order of gases through the respective gas supplying channels, thereby improving the uniformity in thickness of a deposited thin film across the entire surface area of a substrate.

Technical Solution

In an embodiment, there is provided a gas supplying method using a gas distributing unit which supplies a process gas to a first region corresponding to a central region of a gas diffusion space in a substrate processing device and a second region, a third region, a fourth region and a fifth regions, corresponding to respective edges regions of the gas diffusion space, through a first gas supplying channel, a second gas supplying channel, a third gas supplying channel, a fourth gas supplying channel and a fifth gas supplying channel, each of which includes a gas flow rate control device. The gas supplying method may include: a first supplying step of supplying the process gas to the first region through the first gas supplying channel or supplying the process gas to the first to fifth regions through the first to fifth gas supplying channels, respectively; and a second supplying step of supplying the process gas to the second to fifth regions through the second to fifth gas supplying channels, respectively.

In an embodiment, there is provided a gas supplying method using a gas distributing unit which supplies a process gas to a first region corresponding to a central region of a gas diffusion space in a substrate processing device and a second region, a third region, a fourth region and a fifth regions, corresponding to respective edges regions of the gas diffusion space, through a first gas supplying channel, a second gas supplying channel, a third gas supplying channel, a fourth gas supplying channel and a fifth gas supplying channel, each of which includes a gas flow rate control device. The gas supplying method may include: a first supplying step of supplying the process gas to the first region through the first gas supplying channel or supplying the process gas to the first to fifth regions through the first to fifth gas supplying channels, respectively; and a second supplying step of supplying the process gas to one or more regions of the second to fifth regions through one or more gas supplying channels of the second to fifth gas supplying channels, respectively.

Effect of Invention

In accordance with the embodiment of the present disclosure, the gas supplying method using the gas distributing unit may differently control the flow rate of the process gas supplied to the central portion of the substrate and the flow rates of the processing gases supplied to the edge portions of the substrate, and differently adjust the distribution order of the gases supplied to the central portion and the edge portions of the substrate.

Furthermore, the gas supply method may individually control the flow rates and flow times of the process gases supplied to the central portion and the edge portions of the substrate, and differently adjust the distribution order of the gases supplied through the respective gas supplying channels, in order to control the process gas supply. Therefore, it is possible to improve the uniformity in thickness of the deposited thin film across the entire surface area of the substrate.

DETAILED DESCRIPTION OF VARIOUS EMBODIMENTS

Hereafter, exemplary embodiments of the present disclosure will be described in detail with reference to the accompanying drawings. The terms used in this specification and claims should not be construed as being limited as typical and dictionary meanings, but be construed as meanings and concepts which coincide with the technical matters of the present disclosure.

The components illustrated in the embodiments and drawings described in this specification are preferred embodiments of the present disclosure and do not represent all the technical ideas of the present disclosure. Thus, various equivalents and modifications, which can substitute the embodiments, may be present at the time of filing the present application.

A substrate processing device including a gas distributing unit in accordance with an embodiment of the present disclosure includes a process chamber in which a deposition process of a substrate is performed, a gas distributing unit configured to supply and distribute process gas to a gas diffusion space inside a processing chamber, a substrate seating unit configured to support the substrate, and an exhaust unit configured to discharge residual process gas and deposition residual substances within the process chamber to the outside of the processing chamber, after the deposition process is completed.

Hereafter, the gas distributing unit in accordance with the embodiment of the present disclosure will be described in more detail.

Figure 2:
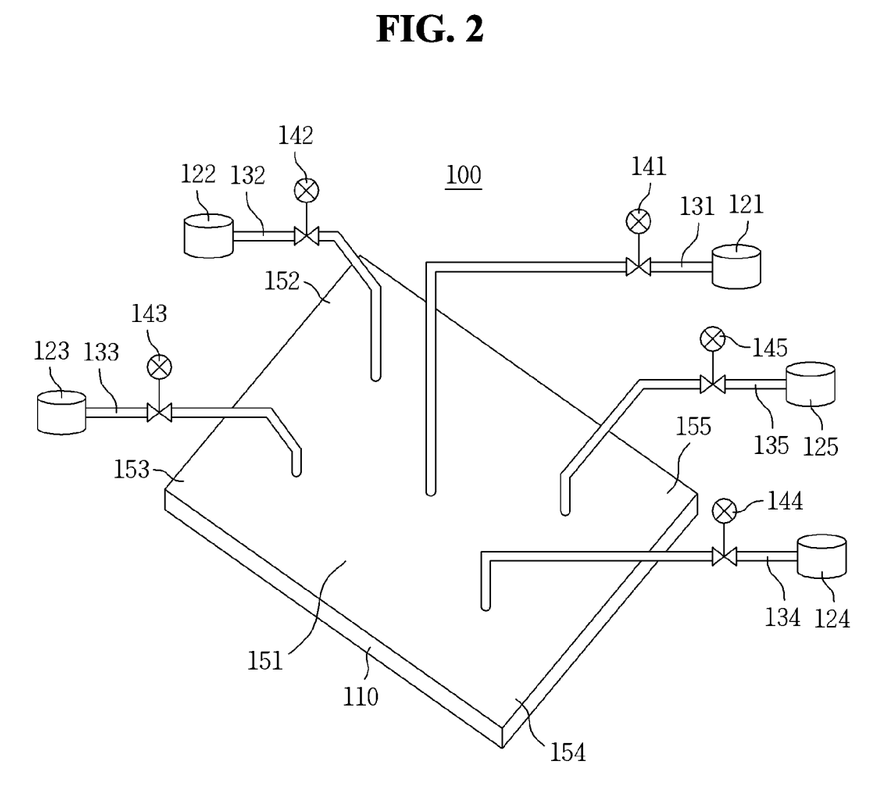
FIG. 2 is a schematic perspective view illustrating a gas distributing unit in accordance with an embodiment of the present disclosure.

FIG. 2 is a schematic perspective view illustrating a gas distributing unit in accordance with an embodiment of the present disclosure. FIG. 2 illustrates that the gas distributing unit includes five gas supplying channels and a gas diffusion space is composed of five regions, but the numbers of the gas supply channels and the regions may be freely modified.

As illustrated in FIG. 2, a gas distributing unit 100 in accordance with the embodiment of the present disclosure includes a gas diffusion plate 110, first to fifth gas supplying sources 121 to 125, first to fifth gas supplying channels 131 to 135, and first to fifth gas flow rate control devices 141 to 145.

The gas diffusion plate 110 has a gas diffusion space which is formed thereover, and in which process gas is diffused. The gas diffusion space may be divided into a first region 151 and second to fifth regions 152 to 155 by a partition wall (not illustrated). The first region 151 corresponds to a center region, and the second to fifth regions 152 to 155 correspond to edge regions.

The process gas is supplied from the first to fifth gas supplying sources 121 to 125 to the first to fifth regions 151 to 155 through the first to fifth gas supplying channels 131 to 135, respectively. FIG. 2 illustrates that the first to fifth gas supplying channels 131 to 135 are connected to the first to fifth gas supplying sources 121 to 125, respectively. However, the first to fifth gas supplying channels 131 to 135 may be connected to one gas supplying source so as to supply process gas.

The first gas supplying channel 131 supplies the process gas to the first region 151 which is the center region of the gas diffusion space, and the second to fifth gas supplying channels 132 to 135 supply the process gas to the second to fifth regions 152 to 155 which are the edge regions of the gas diffusion space.

The first to fifth gas supplying channels 131 to 135 further include the first to fifth gas flow rate control devices 141 to 145 each configured to control the flow rate of the process gas.

The gas distributing unit 100 in accordance with the embodiment of the present disclosure may individually control the flow rates, the supply times and the supply order of the process gases, supplied to the first to fifth regions 151 to 155 through the first to fifth gas supplying channels 131 to 135, by using the first to fifth gas flow rate control devices 141 to 145 installed on the first to fifth gas supplying channels 131 to 135, in order to supply the process gases. At this time, the first to fifth gas flow rate control devices 141 to 145 may also check the flow rates of the process gases supplied through the first to fifth gas supplying channels 131 to 135.

A general substrate processing device includes slot valves and exhaust units, installed in a chamber thereof, and wall heaters installed along the outer wall of the chamber. Therefore, an electrode may be deformed by a temperature imbalance depending on the positions of the slot valves inside the chamber, a pressure imbalance caused by the exhaust units, and an imbalance caused by the size difference between the wall heaters formed on the major and minor axes of the chamber. As a result, a thin film deposited on the central portion of the substrate may have a different thickness from the thin film deposited on an edge portion thereof.

However, the substrate processing device including the gas distributing unit 100 in accordance with the embodiment of the present disclosure may individually control the flow rates, the flow times and the flow order of the processing gases supplied from the first to fifth gas supplying channels 131 to 135 to the first to fifth regions 151 to 155 by using the first to fifth gas flow rate control devices 141 to 145, thereby removing the non-uniformity in thickness between the thin film deposited on the central portion of the substrate and the thin film deposited on the edge portions thereof.

Hereafter, a gas supplying method using a gas distributing unit in accordance with an embodiment of the present disclosure will be described.

Figure 3A:
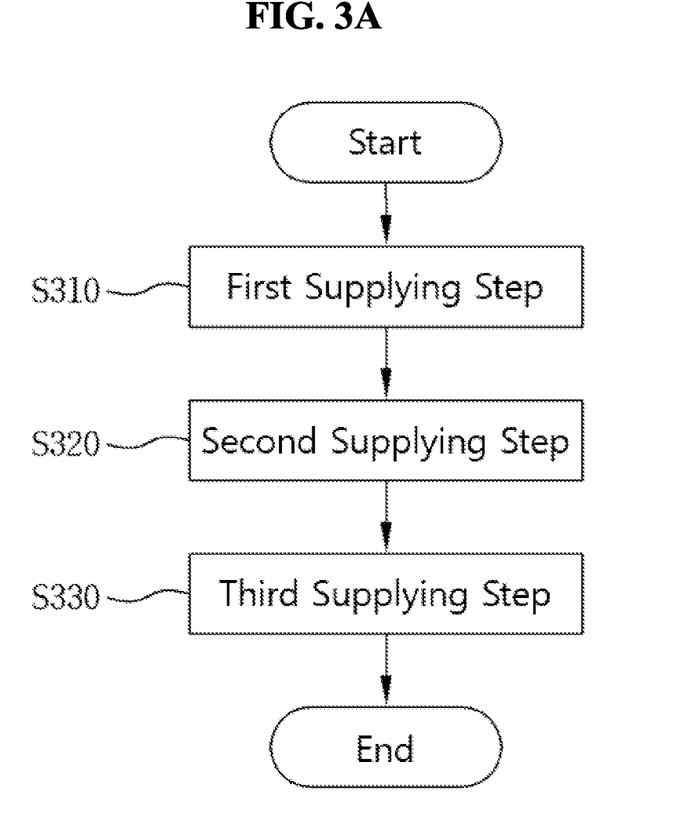
FIG. 3A is a process flowchart illustrating a gas supplying method using a gas distributing unit in accordance with an embodiment of the present disclosure.
Figure 3B:
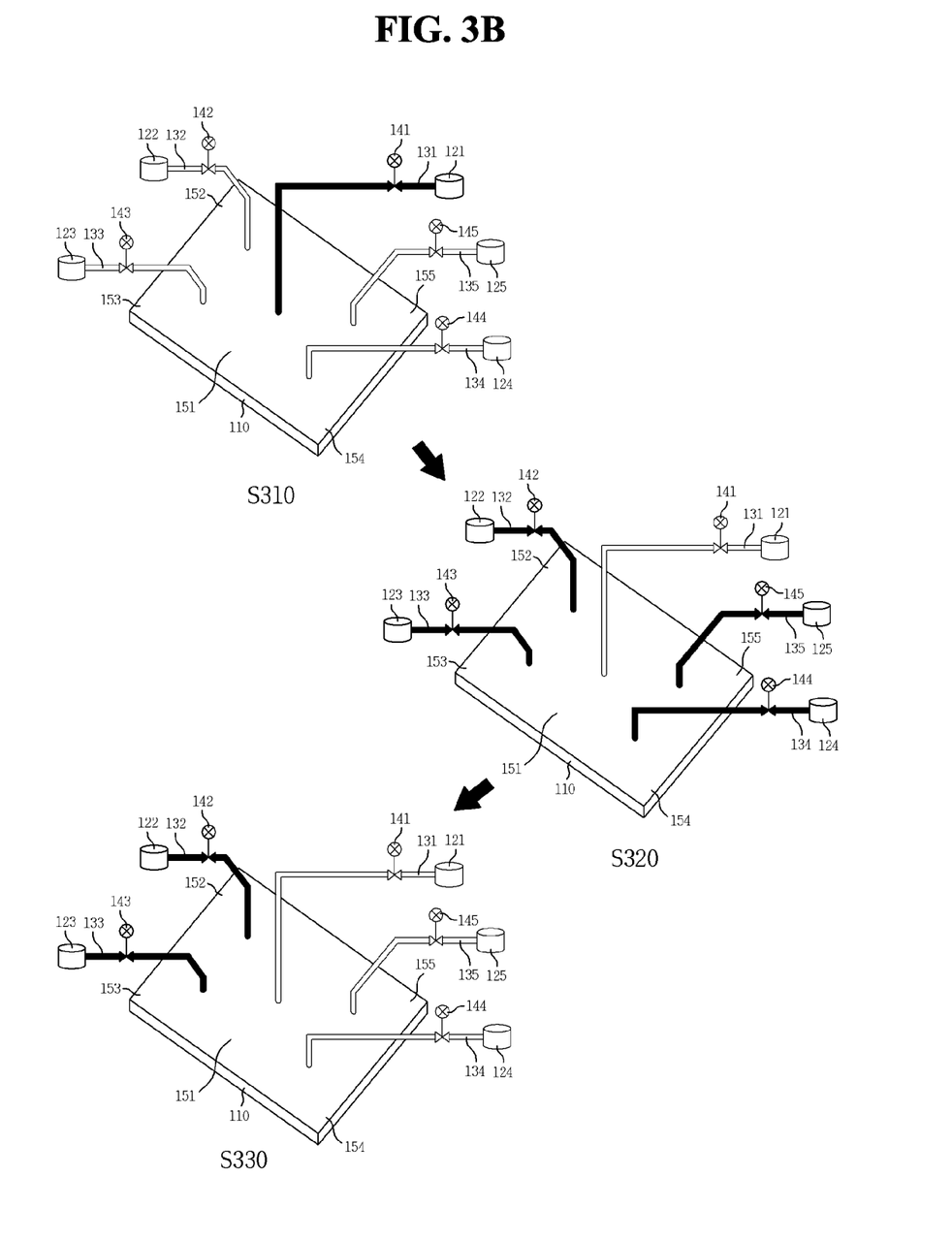
FIG. 3B is a diagram schematically illustrating a process flow in accordance with an embodiment of FIG. 3A.
Figure 3C:
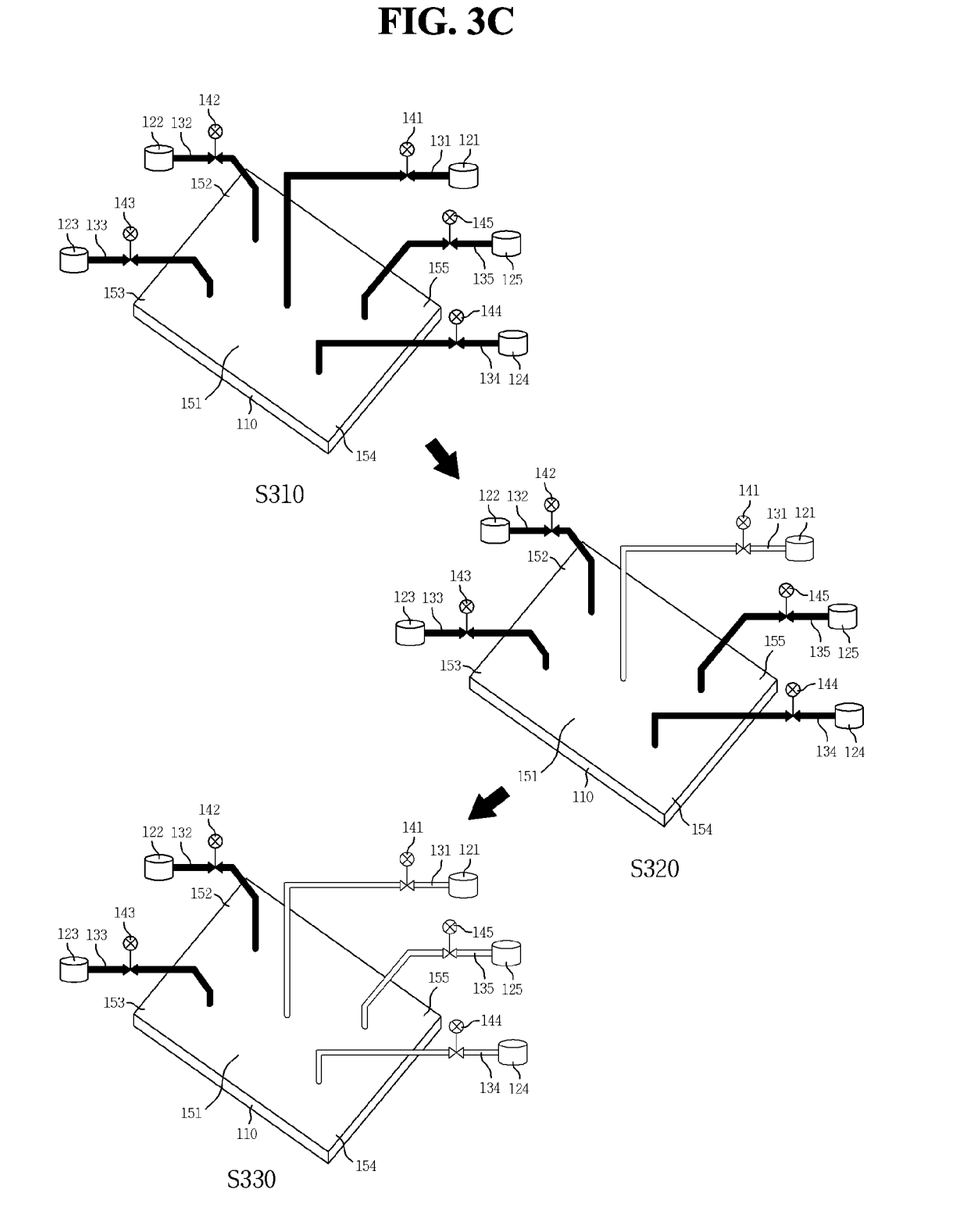
FIG. 3C is a diagram schematically illustrating a process flow in accordance with another embodiment of FIG. 3A.

FIG. 3A is a process flowchart illustrating a gas supplying method using a gas distributing unit in accordance with an embodiment of the present disclosure, FIG. 3B is a diagram schematically illustrating a process flow in accordance with an embodiment of FIG. 3A, and FIG. 3C is a diagram schematically illustrating a process flow in accordance with another embodiment of FIG. 3A.

Referring to FIGS. 3A and 3B, the gas supplying method using the gas distributing unit in accordance with the embodiment of the present disclosure includes a first supplying step S30 and a second supplying step S320.

In the first supplying step S310, the process gas is supplied from the first gas supplying source 121 to the first region 151 corresponding to the center region of the gas diffusion space through the first gas supplying channel 131. At this time, the valves in the second to fifth gas flow rate control devices 142 to 145 installed on the second to fifth gas supplying channels 132 to 135 are all closed, and only the valve in the first gas flow rate control device 141 is opened to supply the process gas only through the first gas supplying channel 131.

The first gas supplying channel 131 has the first gas flow rate control device 141 to control the flow rate of the process gas. In the first supplying step S310, the process gas may be supplied while the valve in the first gas flow rate control device 141 is adjusted to control the flow rate and supply time of the process gas, in order to form a thin film with a desired thickness.

In the first supplying step S310, the process gas supplied to the center through the first gas supplying channel 131 may be supplied onto the substrate through gas spraying units (not illustrated). However, although the process gas supplied to the center is supplied onto the substrate, an electrode may be deformed due to a temperature or pressure imbalance in the chamber. Thus, the thickness of the thin film deposited on the central portion of the substrate may be different from that of the thin film deposited on an edge portion thereof. Furthermore, with the increase in size of the substrate, the process gas supplied to the central portion of the substrate may not sufficiently diffuse to the edge portions thereof, such that the thickness of the thin film deposited on the central portion of the substrate is different from the thickness of the thin film deposited on the edge portion of the substrate. Therefore, there is a need for a process of uniformizing the thickness of the thin film at the edge portions of the substrate with the thickness of the thin film at the central portion of the substrate.

In the second supplying step S320, the process gas is supplied to the second to fifth regions 152 to 155 corresponding to the edge regions of the gas diffusion space through the second to fifth gas supplying channels 132 to 135. At this time, the valve in the first gas flow rate control device 141 is closed, and only the valves in the second to fifth gas flow rate control devices 142 to 145 installed on the second to fifth gas supplying channels 132 to 135 are opened to supply the process gas only through the second to fifth gas supplying channels 132 to 135.

The second to fifth gas supplying channels 132 to 135 have the second to fifth gas flow rate control devices 142 to 145 each configured to control the flow rate of the process gas. In the second supplying step S320, the process gas may be supplied while the valves in the second to fifth gas flow rate control devices 142 to 145 are adjusted to control the flow rate and supply time of the process gas, in order to form the thin film with a desired thickness at the edge portions of the substrate.

That is, as the valves in the second to fifth gas flow rate control devices 142 to 145 are adjusted, the flow rates of the process gases supplied through the second to fifth gas supplying channels 132 to 135 may be set to the same value or different values depending on the deformation of the electrode.

In a general substrate processing device, the deformation of an electrode may occur in a chamber due to a temperature imbalance at a slot valve part, a pressure imbalance by the presence of an exhaust unit and a size imbalance between wall heaters formed on the major and minor axes of the chamber. Such electrode deformation usually occurs at edge portions of the substrate. Thus, depending on the positions of the slot valves and the exhaust units, the thin film deposited on the edge portions of the substrate may have different thicknesses.

Therefore, there is a need for a process of compensating for the thickness of the thin film by selectively supplying the process gas onto a specific portion of the edge portions, where the thin film has a particularly small thickness, in order to uniformize the thickness of the thin film at the edge portions of the substrate.

Thus, the gas supplying method using the gas distributing unit in accordance with the embodiment of the present disclosure may further include a third supplying step S330 of supplying the process gas onto some of the edge portions of the gas diffusion space after the second supplying step S320.

In the third supplying step S330, the process gas is supplied to the second and third regions 152 and 153 corresponding to the edge regions of the gas diffusion space through the second and third gas supplying channels 132 and 133. At this time, the valves in the first, fourth and fifth gas flow rate control devices 141, 144 and 145 are closed, and only the valves in the second and third gas flow rate control devices 142 and 143 installed on the second and third gas supplying channels 132 and 133 are opened to supply the process gas only through the second and third gas supplying channels 132 and 133.

FIG. 3B illustrates that the process gas is supplied to the second and third regions. However, the process gas may be supplied to one or more regions to which the process gas needs to be additionally supplied, among the second to fifth regions, through one or more gas supplying channels of the second to fifth gas supplying channels, in consideration of the thickness of the thin film deposited on the edge portions of the substrate.

The second and third gas supplying channels 132 and 133 include the second and third gas flow rate control devices 142 and 143 each configured to control the flow rates of the process gas. In the third supplying step S330, the process gas may be supplied while the valves in the second and third gas flow rate control devices 142 and 143 are adjusted to control the flow rate and supply time of the process gas, in order to form the thin film with a desired thickness at the edge portions of the substrate.

That is, as the valves in the second and third gas flow rate control devices 142 and 143 are adjusted, the flow rates of the process gases supplied through the second and third gas supplying channels 132 and 133 may be set to the same value or different values depending on the deformation of the electrode.

Referring to FIGS. 3A and 3C, a gas supplying method using a gas distributing unit in accordance with another embodiment of the present disclosure includes a first supplying step S310 and a second supplying step S320.

In the first supplying step S310, the process gas is supplied from the first to fifth gas supplying sources 121 to 125 to the first region 151 corresponding to the center region of the gas diffusion space and the second to fifth regions 152 to 155 corresponding to the edge regions of the gas diffusion region through the first to fifth gas supplying channels 131 to 135. At this time, the valves in the first to fifth gas flow rate control devices 141 to 145 installed on the first to fifth gas supplying channels 131 to 135 are all opened to supply the process gas through the first to fifth gas supplying channels 131 to 135. That is, in the first supplying step S310, the process gas may be supplied while the valves in the first to fifth gas flow rate control devices 141 to 145 are adjusted to control the flow rate and supply time of the process gas, in order to form the thin film with a desired thickness.

In the first supplying step S310, the process gases supplied to the first to fifth regions 151 to 155 through the first to fifth gas supplying channels 131 to 135 may be supplied onto the substrate through gas spraying units (not illustrated). However, although the process gases supplied to the first to fifth regions 151 to 155 are sprayed onto the substrate, an electrode may be deformed due to an imbalance in temperature or pressure in the chamber. Thus, the thickness of the thin film at the central portion of the substrate may be different from the thickness of the thin film at the edge portions of the substrate. Furthermore, with the increase in size of the substrate, the process gas supplied to the central portion of the substrate may not sufficiently diffuse to the edge portions thereof, such that the thickness of the thin film deposited on the central portion of the substrate is different from the thickness of the thin film deposited on the edge portions of the substrate. Therefore, there is a need for a process of uniformizing the thickness of the thin film at the edge portions of the substrate with the thickness of the thin film at the central portion of the substrate.

Thus, the second supplying step S320 is performed after the first supplying step S310. In the second supplying step S320, the process gas is supplied to the second to fifth regions 152 to 155 corresponding to the edge regions of the gas diffusion space through the second to fifth gas supplying channels 132 to 135. Since the second supplying step S320 is performed in the same manner as described with reference to FIG. 3B, the detailed descriptions thereof will be omitted herein.

Furthermore, the deformation of an electrode may occur in a chamber due to a temperature imbalance at a slot valve part, a pressure imbalance by the presence of an exhaust unit and a size imbalance between wall heaters formed on the major and minor axes of the chamber. Such electrode deformation usually occurs at edge portions of the substrate. Thus, depending on the positions of the slot valves and the exhaust units, the thin film deposited on the edge portions of the substrate may have different thicknesses.

Therefore, there is a need for a process of compensating for the thickness of the thin film by selectively supplying the process gas onto a specific portion of the edge portions, where the thin film has a particularly small thickness, in order to uniformize the thickness of the thin film at the edge portions of the substrate.

Thus, the gas supplying method may further include a third supplying step S330 after the second supplying step S320. Since the third supplying step S330 is performed in the same manner as described with reference to FIG. 3B, the detailed descriptions thereof will be omitted herein.

Figure 4A:
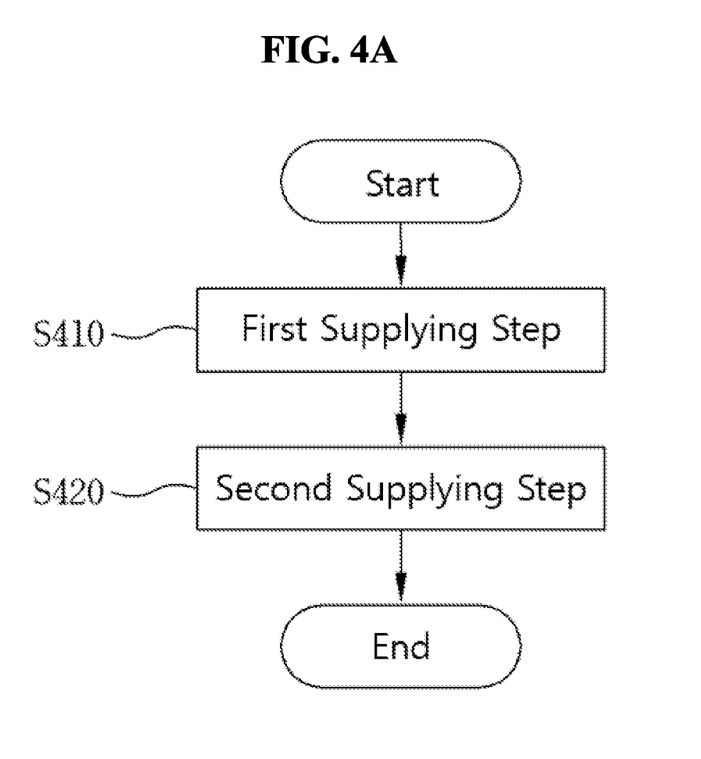
FIG. 4A is a process flowchart illustrating a gas supplying method using a gas distributing unit in accordance with an embodiment of the present disclosure.
Figure 4B:
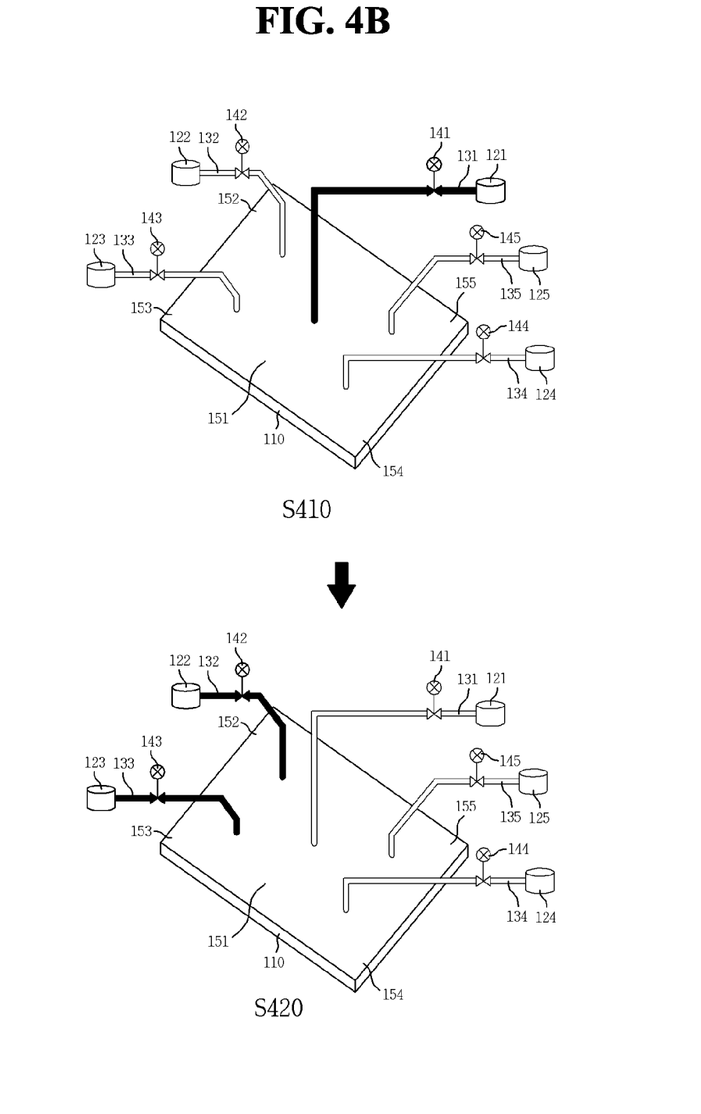
FIG. 4B is a diagram schematically illustrating a process flow in accordance with an embodiment of FIG. 4A.
Figure 4C:
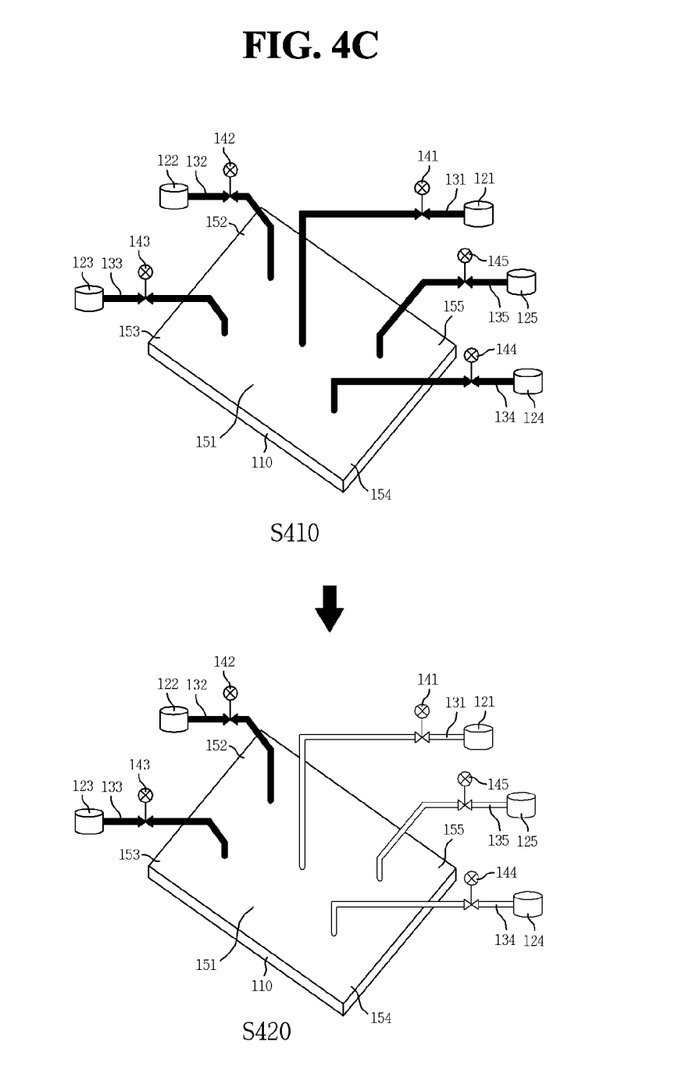
FIG. 4C is a diagram schematically illustrating a process flow in accordance with another embodiment of FIG. 4A.

FIG. 4A is a process flowchart illustrating a gas supplying method using a gas distributing unit in accordance with another embodiment of the present disclosure, FIG. 4B is a diagram schematically illustrating a process flow in accordance with an embodiment of FIG. 4A, and FIG. 4C is a diagram schematically illustrating a process flow in accordance with another embodiment of FIG. 4A.

Referring to FIGS. 4A and 4B, the gas supplying method using the gas distributing unit in accordance with the embodiment of the present disclosure includes a first supplying step S410 and a second supplying step S420.

In the first supplying step S410, the process gas is supplied from the first gas supplying source 121 to the first region 151 corresponding to the center region of the gas diffusion space through the first gas supplying channel 131. At this time, the valves in the second to fifth gas flow rate control devices 142 to 145 installed on the second to fifth gas supplying channels 132 to 135 are all closed, and only the valve in the first gas flow rate control device 141 is opened to supply the process gas only through the first gas supplying channel 131.

The first gas supplying channel 131 has the first gas flow rate control device 141 to control the flow rate of the process gas. In the first supplying step S410, the process gas may be supplied while the valve in the first gas flow rate control device 141 is adjusted to control the flow rate and supply time of the process gas, in order to form a thin film with a desired thickness.

In the first supplying step S410, the process gas supplied to the center through the first gas supplying channel 131 may be supplied onto the substrate through a gas spraying unit (not illustrated). However, although the process gas supplied to the center is supplied onto the substrate, an electrode may be deformed due to a temperature or pressure imbalance in the chamber. Thus, the thickness of the thin film deposited on the central portion of the substrate may be different from that of the thin film deposited on the edge portions thereof. Therefore, there is a need for a process of uniformizing the thickness of the thin film at the edge portions of the substrate with the thickness of the thin film at the central portion of the substrate.

In the second supplying step S420, the process gas is supplied to the second and third regions 152 and 153 corresponding to the edge regions of the gas diffusion space through the second and third gas supplying channels 132 and 133. At this time, the valves in the first, fourth and fifth gas flow rate control devices 141, 144 and 145 are closed, and only the valves in the second and third gas flow rate control devices 142 and 143 installed on the second and third gas supplying channels 132 and 133 are opened to supply the process gas only through the second and third gas supplying channels 132 and 133.

FIG. 4B illustrates that the process gas is supplied to the second and third regions. However, the process gas may be supplied to one or more regions of the second to fifth regions through one or more gas supplying channels of the second to fifth gas supplying channels.

The second and third gas supplying channels 132 and 133 include the second and third gas flow rate control devices 142 and 143 each configured to control the flow rates of the process gas. In the second supplying step S420, the process gas may be supplied while the valves in the second and third gas flow rate control devices 142 and 143 are adjusted to control the flow rate and supply time of the process gas, in order to form the thin film with a desired thickness at the edge portions of the substrate.

That is, as the valves in the second and third gas flow rate control devices 142 and 143 are adjusted, the flow rates of the process gases supplied through the second and third gas supplying channels 132 and 133 may be set to the same value or different values depending on the deformation of the electrode.

Referring to FIGS. 4A and 4C, a gas supplying method using a gas distributing unit in accordance with another embodiment of the present disclosure includes a first supplying step S410 and a second supplying step S420.

In the first supplying step S410, the process gas is supplied from the first to fifth gas supplying sources 121 to 125 to the first region 151 corresponding to the center region of the gas diffusion space and the second to fifth regions 152 to 155 corresponding to the edge regions of the gas diffusion space through the first to fifth gas supplying channels 131 to 135. At this time, the valves in the first to fifth gas flow rate control devices 141 to 145 installed on the first to fifth gas supplying channels 131 to 135 are all opened to supply the process gas through the first to fifth gas supplying channels 131 to 135. That is, in the first supplying step S410, the process gas may be supplied while the valves in the first to fifth gas flow rate control devices 141 to 145 are adjusted to control the flow rate and supply times of the process gas, in order to form a thin film with a desired thickness.

In the first supplying step S410, the process gas supplied to the first to fifth regions 151 to 155 through the first to fifth gas supplying channels 131 to 135 may be supplied onto the substrate through gas spraying units (not illustrated). However, although the process gas supplied to the first to fifth regions 151 to 155 is sprayed onto the substrate, an electrode may be deformed due to an imbalance in temperature or pressure in the chamber. Thus, the thickness of the thin film at the central portion of the substrate may be different from that of the thin film at the edge portions of the substrate. Therefore, there is a need for a process of uniformizing the thickness of the thin film at the edge portions of the substrate with the thickness of the thin film at the central portion of the substrate.

In the second supplying step S420, the process gas is supplied to the second and third regions 152 and 153 corresponding to the edge regions of the gas diffusion space through the second and third gas supplying channels 132 and 133. The second supplying step S420 is performed in the same manner as described with reference to FIG. 4B.

At this time, the flow rate of the process gas supplied to the first region through the first gas supplying channel 131 may be set in the range of 40% to 80% of the entire process gas, and the flow rate of the process gas supplied to the second to fifth regions through the second to fifth gas supplying channels 132 to 135 may be set in the range of 20% to 60% of the entire process gas.

When the flow rate of the process gas supplied to the first region through the first gas supplying channel 131 is less than 40% of the entire process gas supplied, the process gas may not sufficiently diffuse from the central portion to the edge portions. When the flow rate of the process gas supplied to the first region through the first gas supplying channel 131 exceeds 80% of the entire process gas supplied, a large amount of process gas may be unnecessarily supplied to the central portion. In this case, the efficiency of the gas supply may be degraded.

In the above-described gas supplying method using the gas distributing unit in accordance with the embodiment of the present disclosure, the gas distributing unit may include the plurality of gas supplying channels configured to supply the process gas into the substrate processing device and the gas flow rate control devices configured to check the flow rates of the process gas supplied through the respective gas supplying channels, control the flow rates of the processing gases supplied through the respective gas supplying channels, and adjust the supply order and the supply time of the process gas, thereby improving the uniformity in thickness of the deposited thin film across the entire surface area of the substrate.

What is claimed is:

1. A gas supplying method using a gas distributing unit which supplies a process gas to a first region corresponding to a central region of a gas diffusion space in a substrate processing device and a second region, a third region, a fourth region and a fifth regions, corresponding to respective edges regions of the gas diffusion space, through a first gas supplying channel, a second gas supplying channel, a third gas supplying channel, a fourth gas supplying channel and a fifth gas supplying channel, the first to fifth gas supplying channel includes a first gas flow rate control device, a second gas flow rate control device, a third gas flow rate control device, a fourth gas flow rate control device and a fifth gas flow rate control device, respectively, the gas supplying method comprising:

a first supplying step of supplying the process gas to the first region through the first gas supplying channel or supplying the process gas to the first to fifth regions through the first to fifth gas supplying channels, respectively; and a second supplying step of supplying the process gas to the second to fifth regions through the second to fifth gas supplying channels, respectively, wherein the second supplying step is performed sequentially after the first supplying step, and wherein the first supplying step is performed during a time corresponding to 40% to 80% of the entire process time.

2. The gas supplying method of claim 1, further comprising a third supplying step of supplying the process gas to one or more regions of the second to fifth regions through one or more gas supplying channels of the second to fifth gas supplying channels, respectively.

3. The gas supplying method of claim 1, wherein when the process gas is supplied through the first to fifth gas supplying channels, the flow rates of the process gas respectively in first to fifth gas supplying channels are individually controlled through the first to fifth gas flow rate control devices installed on the first to fifth gas supplying channels, respectively, in order to supply the process gases.

4. The gas supplying method of claim 1, wherein when the process gases are supplied through the first to fifth gas supplying channels, the supply times of the process gas respectively in first to fifth gas supplying channels are individually controlled through the first to fifth gas flow rate control devices installed on the first to fifth gas supplying channels, respectively, in order to supply the process gases.

5. A gas supplying method using a gas distributing unit which supplies a process gas to a first region corresponding to a central region of a gas diffusion space in a substrate processing device and a second region, a third region, a fourth region and a fifth regions, corresponding to respective edges regions of the gas diffusion space, through a first gas supplying channel, a second gas supplying channel, a third gas supplying channel, a fourth gas supplying channel and a fifth gas supplying channel, the first to fifth gas supplying channel includes a first gas flow rate control device, a second gas flow rate control device, a third gas flow rate control device, a fourth gas flow rate control device and a fifth gas flow rate control device, respectively, the gas supplying method comprising:

a first supplying step of supplying the process gas to the first region through the first gas supplying channel or supplying the process gas to the first to fifth regions through the first to fifth gas supplying channels, respectively; and a second supplying step of supplying the process gas to one or more regions of the second to fifth regions through one or more gas supplying channels of the second to fifth gas supplying channels, respectively, wherein the second supplying step is performed sequentially after the first supplying step, and wherein the first supplying step is performed during a time corresponding to 40% to 80% of the entire process time.

\* \* \* \* \*